US012764451B2

(12) United States Patent
Yue et al.

(10) Patent No.: US 12,764,451 B2
(45) Date of Patent: Oct. 13, 2026

(54) SPEAKER ASSEMBLY, MAGNETIC FIELD COUNTERACTING METHOD, AND ELECTRONIC DEVICE

(71) Applicant: BEIJING XIAOMI MOBILE SOFTWARE CO., LTD., Beijing (CN)

(72) Inventors: Xiaolong Yue, Beijing (CN); Min Zhang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 595 days.

(21) Appl. No.: 18/140,495

(22) Filed: Apr. 27, 2023

(65) Prior Publication Data

US 2024/0214717 A1 Jun. 27, 2024

(30) Foreign Application Priority Data

Dec. 21, 2022 (CN) ......................... 202211652219.0

(51) Int. Cl.

*H04R 1/1025* (2026.01)
*H04R 1/10* (2006.01)
*H05K 9/00* (2006.01)

(52) U.S. Cl.

CPC ......... *H04R 1/1025* (2013.01); *H04R 1/1091* (2013.01); *H05K 9/0075* (2013.01)

(58) Field of Classification Search

CPC ........ H04R 1/1075; H04R 9/06; H04R 9/025; H04R 1/1025; H04R 1/06
See application file for complete search history.

(56) References Cited

FOREIGN PATENT DOCUMENTS

| | | |
|---|---|---|
| CN | 217215005 U | 8/2022 |
| CN | 217691453 U | 10/2022 |
| CN | 217933902 U | 11/2022 |

OTHER PUBLICATIONS

European Patent Application No. 23172797.5, Search and Opinion dated Oct. 20, 2023, 8 pages.

*Primary Examiner* — Kile O Blair
(74) *Attorney, Agent, or Firm* — Cozen O'Connor

(57) ABSTRACT

A speaker assembly includes a magnetic field counteracting component arranged on an end face of an audio component facing a battery with positive and negative electrode tabs. When a counteracting current into a conductor forms a counteracting magnetic field acting on the audio component, the counteracting magnetic field counteracts an interfering magnetic field acting by the battery on the audio component. The conductor includes a first end and a second end such that, in a thickness direction of the battery, the first end corresponds to a position of a positive electrode tab and the second end corresponds to a position of a negative electrode tab.

18 Claims, 2 Drawing Sheets

SPEAKER ASSEMBLY, MAGNETIC FIELD COUNTERACTING METHOD, AND ELECTRONIC DEVICE

CROSS-REFERENCE TO RELATED APPLICATION

This application is based on and claims priority to Chinese Patent Application No. 202211652219.0 filed on Dec. 21, 2022, the entire content of which is incorporated herein by reference for all purposes.

BACKGROUND

Speakers are used in electronic devices such as mobile phones and earphones. Speakers are prone to electromagnetic interference generated by internal components of the devices during operation, which results in noise and poor speaker performance. The interference problem becomes serious as the sensitivity of speakers increases, degrading user experience.

SUMMARY

A first aspect of the present disclosure provides a speaker assembly. The speaker assembly includes: a battery including a core, a positive electrode tab, and a negative electrode tab, the positive electrode tab and the negative electrode tab being electrically connected to the core and being arranged on a first end face of the core; an audio component including a second end face facing the first end face; and a magnetic field counteracting component arranged on the second end face and including a conductor and an insulating layer between the conductor and the second end face. A counteracting current into the conductor forms a counteracting magnetic field acting on the audio component, and the counteracting magnetic field counteracts an interfering magnetic field acting by the battery on the audio component.

A second aspect of the present disclosure provides an earphone including a speaker assembly. The speaker assembly includes: a battery including a core, a positive electrode tab, and a negative electrode tab, the positive electrode tab and the negative electrode tab being electrically connected to the core and being arranged on a first end face of the core; an audio component including a second end face facing the first end face; and a magnetic field counteracting component arranged on the second end face and including a conductor and an insulating layer between the conductor and the second end face. A counteracting current into the conductor forms a counteracting magnetic field acting on the audio component, and the counteracting magnetic field counteracts an interfering magnetic field acting by the battery on the audio component.

A third aspect of the present disclosure provides a magnetic field counteracting method applied to a speaker assembly. The speaker assembly includes: a battery including a core, a positive electrode tab, and a negative electrode tab, the positive electrode tab and the negative electrode tab being electrically connected to the core and being arranged on a first end face of the core; an audio component including a second end face facing the first end face; and a magnetic field counteracting component arranged on the second end face and including a conductor and an insulating layer between the conductor and the second end face. A counteracting current into the conductor forms a counteracting magnetic field acting on the audio component, and the counteracting magnetic field counteracts an interfering magnetic field acting by the battery on the audio component. The magnetic field counteracting method includes: determining an assembly region of the conductor based on positions of the positive electrode tab and the negative electrode tab; and arranging the magnetic field counteracting component on the second end face, fixing the conductor in the assembly region, and arranging the insulating layer between the conductor and the second end face.

BRIEF DESCRIPTION OF DRAWINGS

In order to more clearly explain technical solutions in embodiments of the present disclosure, drawings required in the description of the embodiments will be briefly introduced. Obviously, the drawings in the following description illustrate only some embodiments of the present disclosure. For those skilled in the art, other drawings can be obtained from these drawings without any creative effort.

DETAILED DESCRIPTION

Figure 1:
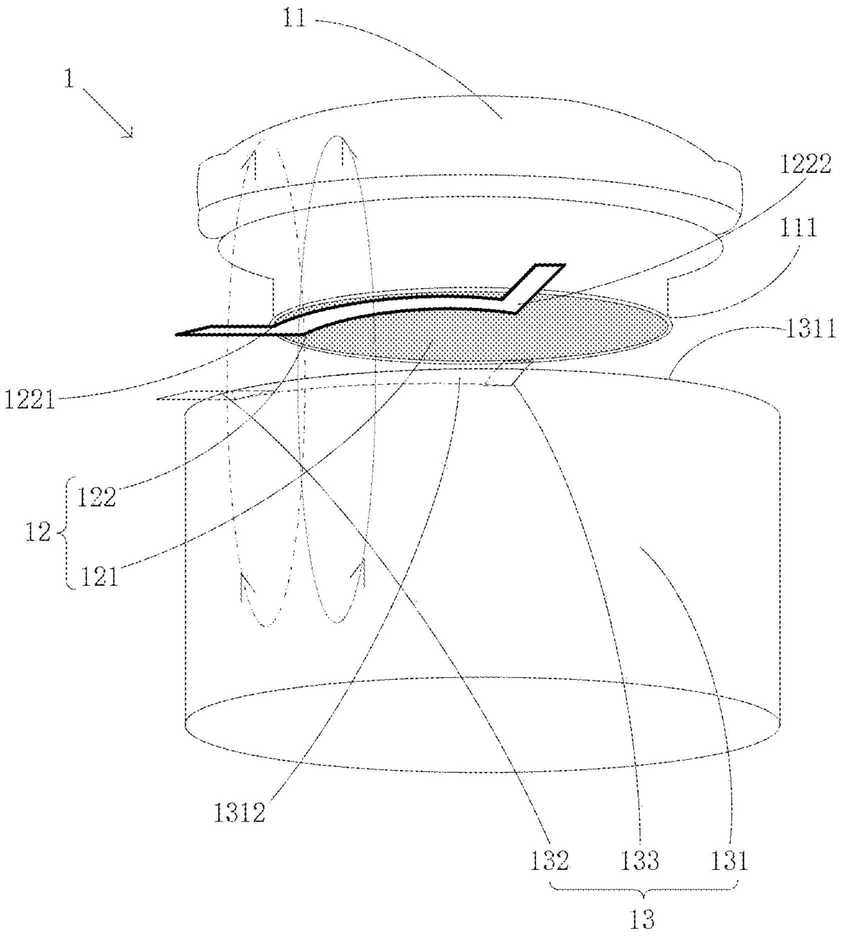
FIG. 1 is an exploded view of a speaker assembly according to an embodiment of the present disclosure.

The present disclosure relates to a field of electronic technology, and more particularly, a speaker assembly, a magnetic field counteracting method, and an electronic device.

Embodiments of the present disclosure will be described in detail below, and examples of the described embodiments are shown in the drawings. When the following description refers to the drawings, unless otherwise indicated, the same or similar elements are denoted by like reference numerals throughout the drawings. The implementations described in the following embodiments do not represent all embodiments consistent with the present disclosure. Instead, they are only examples of devices and methods consistent with some aspects of the present disclosure.

Terms used in the present disclosure are only for the purpose of describing specific embodiments, and are not intended to limit the present disclosure. Unless otherwise defined, technical or scientific terms in the present disclosure should have usual meaning understood by a person with ordinary skills in the field to which the present disclosure belongs. Terms such as “first” and “second” are used herein are not intended to indicate any sequence, quantity or importance, but are only used to distinguish different elements. Similarly, words such as “an” or “a” do not indicate a quantitative restriction, but rather indicate the existence of at least one. If only “one” is referred to, it will be indicated specifically. “A plurality of” or “several” means two or more. Unless otherwise indicated, terms “front,” “rear,” “lower,” and/or “upper,” “top,” “bottom,” and the like are for illustrative purposes only, and are not limited to a particular location or spatial orientation. Terms such as “including” or “comprising” mean that elements or objects appearing before “including” or “comprising” contains elements or objects listed after “including” or “comprising” and their equivalents, and do not exclude other elements or objects. Terms such as “coupled” or “connected” are not limited to physical or mechanical connections, and may include electrical connections, regardless of direct or indirect connections.

Speakers are used in electronic devices such as mobile phones and earphones. Speakers are prone to electromagnetic interference generated by internal components of the devices during operation, and result in noise. The interference problem becomes serious as the sensitivity of speakers increases, degrading user experience. In the related art, shielding schemes directed at interference sources are often adopted, but the schemes are not only costly, but also difficult to achieve overall coverage of the interference sources, and hence fail to weaken an electromagnetic field across the entire space. Consequently, speakers are still subjected to electromagnetic interference during operation.

The present disclosure provides a speaker assembly. FIG. 1 is an exploded view of a speaker assembly according to an embodiment of the present disclosure. As shown in FIG. 1, a dotted arrow represents a direction of a magnetic field generated by a conductor 122, and a dash-dotted arrow represents a direction of a magnetic field generated by system current of a battery 13. The speaker assembly 1 includes a battery 13, an audio component 11, and a magnetic field counteracting component 12. The battery 13 includes a core 131, a positive electrode tab 132, and a negative electrode tab 133. The positive electrode tab 132 and the negative electrode tab 133 are electrically connected to the core 131 and are arranged on a first end face 1311 of the core 131. The audio component 11 includes a second end face 111 facing the first end face 1311. The magnetic field counteracting component 12 is arranged on the second end face 111. The magnetic field counteracting component 12 includes the conductor 122, and an insulating layer 121 between the conductor 122 and the second end face 111. A counteracting current into the conductor 122 forms a counteracting magnetic field acting on the audio component 11, and the counteracting magnetic field counteracts an interfering magnetic field acting by the battery 13 on the audio component 11.

Since the speaker assembly 1 includes the magnetic field counteracting component 12, and the magnetic field counteracting component 12 is arranged on the end face of the audio component 11 facing the battery 13 with the electrode tabs, when the counteracting current into the conductor 122 forms the counteracting magnetic field acting on the audio component 11, the counteracting magnetic field and the interfering magnetic field applied by the battery 13 to the audio component 11 can cancel each other out. The above solution is directed at counteraction of the interfering magnetic field acting on the audio component 11, has low cost, high accuracy, and few structural changes, and improves the sensitivity and sound effect of the speaker assembly 1. In addition, the arrangement of the magnetic field counteracting component 12 on the audio component 11 can make the conductor 122 close to coils of the audio component 11, improving the counteraction accuracy and counteraction effect. Since the interfering magnetic field acting on the audio component 11 is cancelled out, the speaker assembly 1 can be used as a high-sensitivity speaker.

The above solution can reduce a current sound by 8 dB, significantly improve the sound production effect, expand an effective low-radiation area by more than 5 times, and have a cost benefit of about 50%.

It should be noted that the battery 13 may be a soft-packed battery or a hard-packed battery, which will not be limited in the present disclosure. When the battery is a soft-packed battery, the positive electrode tab 132 and the negative electrode tab 133 are exposed outside the core 131. The positive electrode tab 132 and the negative electrode tab 133 exposed outside the core 131 can facilitate position identification, determining a position of a main interfering magnetic field acting on the audio component 11, helping to improve the accuracy and convenience of the arrangement of the magnetic field counteracting component 12. When the battery 13 is a hard-packed battery, the positive electrode tab 132 and the negative electrode tab 133 are arranged inside the core 131. Positions of the positive electrode tab 132 and the negative electrode tab 133 can be determined by X-rays, determining the position of the main interfering magnetic field, and improving the accuracy of the arrangement of the magnetic field counteracting component 12. In a thickness direction of the battery 13, at least a portion of the conductor 122 corresponds to the positions of the positive electrode tab 132 and the negative electrode tab 133.

In embodiments of the present disclosure, by providing the conductor 122 for the speaker assembly 1 and defining the arrangement position of the conductor 122, the counteracting magnetic field generated by the conductor 122 and the interfering magnetic field can cancel each other out. The arrangement position, material, and assembly method of the conductor 122 is explained by way of example.

In some embodiments, the conductor 122 includes a first end 1221 and a second end 1222. In the thickness direction of the battery 13, the first end 1221 corresponds to the position of the positive electrode tab 132, and the second end 1222 corresponds to the position of the negative electrode tab 133. By defining positions of the two ends of the conductor 122, a region where the conductor 122 generates a magnetic field can be basically determined, and the magnetic field acting on audio component 11 and the interfering magnetic field can cancel each other out.

In the above embodiments, the core 131 forms a main interference section 1312 between the positive electrode tab 132 and the negative electrode tab 133, and a projection of the conductor 122 in the thickness direction of the battery 13 coincides with the main interference section 1312. By defining the position of the conductor 122 as a whole, it can be determined that the region where the conductor 122 generates the magnetic field basically coincides with a region where the interfering magnetic field is generated. At this time, by making the counteracting current equal in magnitude and opposite in direction to the system current, the interfering magnetic field acting on the audio component 11 can be counteracted.

The first end 1221 and the second end 1222 can be bent relative to the conductor 122 and the core at a position corresponding to the main interference section 1312, and can extend towards the core away from the conductor 122 after bending, to facilitate access to the current.

In other embodiments, a projection of a structure of the conductor 122 between the first end 1221 and the second end 1222 in the thickness direction of the battery 13 slightly deviates from the position of the main interference section 1312 of the battery 13. The deviation caused by the above structural shape and position has no influence on the counteracting magnetic field acting on the audio component 11 and does not need to be considered; and if there is any influence, it can also be adjusted by the magnitude of the counteracting current.

In the above embodiments, the conductor 122 can be connected in series with the battery 13, to obtain the counteracting current that is equal in magnitude and opposite in direction to the system current of the battery 13. The way in which the conductor 122 is connected in series with the battery 13 can simplify the structure and control scheme of the speaker assembly 1. When the speaker assembly 1 is working, the conductor 122 can obtain the counteracting current equal in magnitude and opposite in direction to the system current.

In other embodiments, the counteracting current into the conductor 122 can also be controlled through a control mainboard of the speaker assembly 1. The control mainboard monitors the system current of the battery 13 and obtains the magnitude of the counteracting current through calculation, and the counteracting current is input into the conductor 122.

In the above embodiments, an included angle between the positive electrode tab 132 and the negative electrode tab 133 may be 90°, and the conductor 122 includes a ¼ circular ring assembled on the insulating layer 121. The ¼ circular ring of the conductor 122 corresponds, in position, to the main interference section 1312, which is between the positive electrode tab 132 and the negative electrode tab 133 and generates a strong magnetic field, so that a more accurate counteraction effect can be obtained.

In other embodiments, the included angle between the positive electrode tab 132 and the negative electrode tab 133 is 180°, and the conductor 122 includes a ½ circular ring assembled on the insulating layer 121. The ½ circular ring of the conductor 122 corresponds, in position, to the main interference section 1312, which is between the positive electrode tab 132 and the negative electrode tab 133 and generates a strong magnetic field, so that a more accurate counteraction effect can be obtained.

In other embodiments, the included angle between the positive electrode tab 132 and the negative electrode tab 133 can also be any other angle, which is not limited in the present disclosure. The length and position of the conductor 122 can be adjusted according to the included angle between the positive electrode tab 132 and the negative electrode tab 133. The present disclosure does not limit the specific length and shape of the conductor 122.

Figure 2:
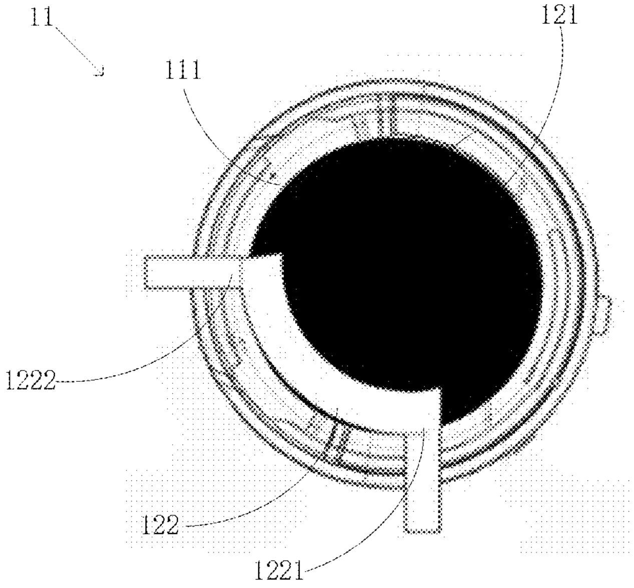
FIG. 2 is a schematic view of an audio component of the speaker assembly of FIG. 1, according to an embodiment of the present disclosure.

In some embodiments, as shown in FIGS. 1 and 2, the conductor 122 is in an edge region of the second end face 111, to reduce structural interference of the conductor 122 with the audio component 11 or other components of the speaker assembly 1, and improve the convenience of the structural assembly of the conductor 122. In other embodiments, the conductor 122 is located at any other location on the second end face 111, which will not be limited in the present disclosure. For example, when a structural size of the audio component 11 is smaller than a structural size of the battery 13, the conductor 122 is at an edge position of the audio component 11 to be close to the positions of the electrode tabs, thereby generating the counteracting magnetic field that matches the interfering magnetic field. When the structural size of the audio component 11 is larger than the structural size of the battery 13, the conductor 122 is in the middle of the audio component 11 to be close to the positions of the electrode tabs, thereby generating the counteracting magnetic field that matches the interfering magnetic field.

In the above embodiments, the conductor 122 is a flexible circuit board or a wire assembled on the insulating layer 121. The conductor 122 has a flat structure when it is a flexible circuit board, and hence can reduce space occupation and improve assembly convenience.

The conductor 122 is fixed to the insulating layer 121 by adhesive bonding or is fixed to the insulating layer 121 by other means such as clamping.

The insulating layer 121 can avoid functional interference of the conductor 122 with the audio component 11. In some embodiments, the insulating layer 121 covers the second end face 111, increasing a working area of the insulating layer 121 to avoid the functional interference of the conductor 122 with the audio component 11.

In some embodiments, the insulating layer 121 is a packaging structural member on the audio component 11. The packaging structural member serves as a partial structure of the audio component 11, and there is no need to add the insulating layer 121 to the audio component 11. In other embodiments, the insulating layer 121 is an insulating adhesive layer bonded to the audio component 11. The insulating adhesive layer cannot only avoid the functional interference of the conductor 122 with the audio component 11, but also be fixed to the audio component 11 using its own adhesive function.

The insulating layer 121 is a double-sided adhesive that cannot only be bonded to the audio component 11, but also achieve the bonding and fixation of the conductor 122.

Figure 3:
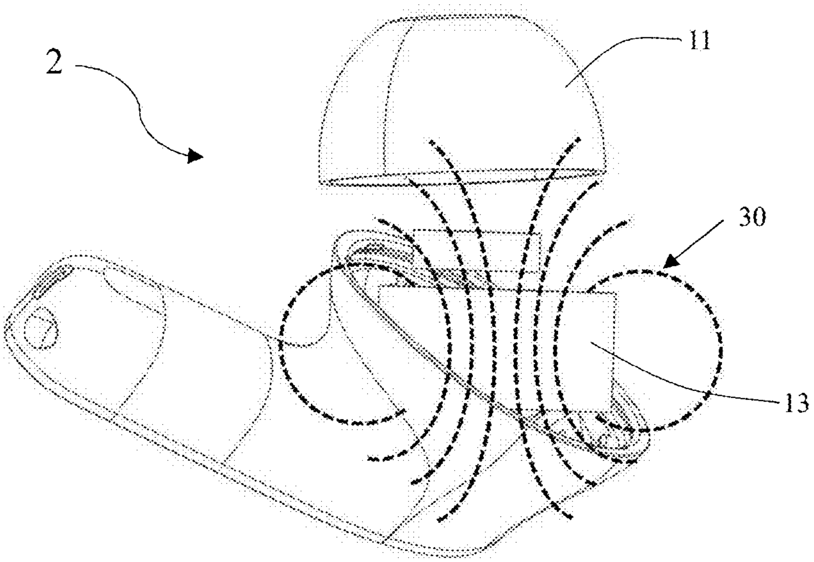
FIG. 3 is a schematic view of an earphone according to an embodiment of the present disclosure.

The present disclosure further provides an earphone 2. As shown in FIG. 3, the earphone 2 includes the speaker assembly 1 described above. A magnetic field 30 generated by the battery 13 of the speaker assembly 1 is shown in FIG. 3. The magnetic field counteracting component 12 on the audio component 11 can counteract the interfering magnetic field exerted by the battery 13 on the audio component 11 by using the counteracting magnetic field generated by the conductor 122.

Since the speaker assembly 1 includes the magnetic field counteracting component 12, and the magnetic field counteracting component 12 is on the end face of the audio component 11 facing the battery 13 with the electrode tabs, when the counteracting current into the conductor 122 forms the counteracting magnetic field acting on the audio component 11, the counteracting magnetic field and the interfering magnetic field acting by the battery 13 on the audio component 11 can cancel each other out. The above solution is directed at counteraction of the interfering magnetic field acting on the audio component 11, has low cost, high accuracy, and few structural changes, and improves the sound effect of the speaker assembly 1 and the earphone 2 using the speaker assembly 1.

It should be noted that the speaker assembly 1 may be applied to wearable devices such as mobile phones and smart watches, which will not be limited in the present disclosure.

Figure 4:
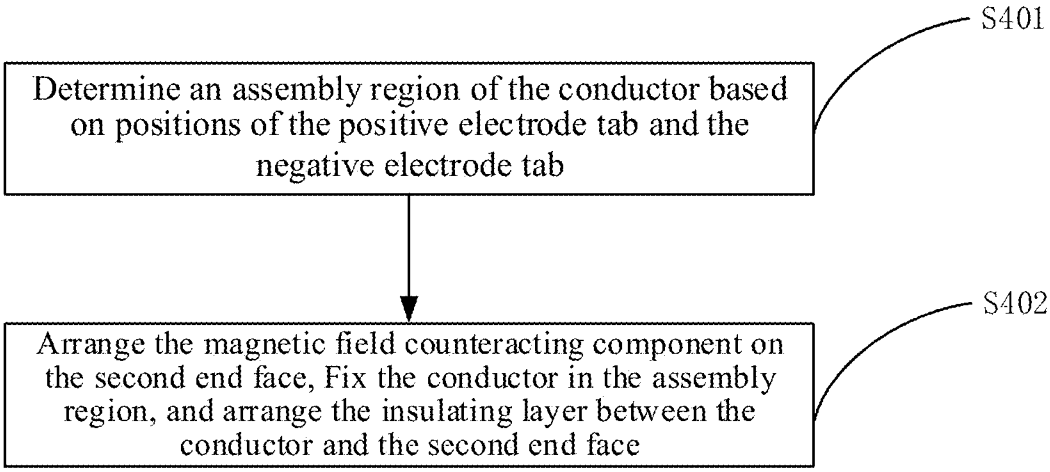
FIG. 4 is a flowchart of a magnetic field counteracting method according to an embodiment of the present disclosure.

The present disclosure further provides a magnetic field counteracting method applied to the speaker assembly 1 described above. FIG. 4 is a flowchart of a magnetic field counteracting method according to an embodiment of the present disclosure. As shown in FIG. 4, the magnetic field counteracting method can be realized through the following steps.

In step S401, an assembly region of the conductor 122 is determined based on the positions of the positive electrode tab 132 and the negative electrode tab 133.

In step S402, the magnetic field counteracting component 12 is arranged on the second end face 111, the conductor 122 is fixed in the assembly region, and the insulating layer 121 is arranged between the conductor 122 and the second end face 111.

Since the speaker assembly 1 includes the magnetic field counteracting component 12, and the magnetic field counteracting component 12 is on the end face of the audio component 11 facing the battery 13 with the electrode tabs, when the counteracting current into the conductor 122 forms the counteracting magnetic field acting on the audio component 11, the counteracting magnetic field and the interfering magnetic field acting by the battery 13 on the audio component 11 can cancel each other out. Since the above solution first determines the assembly region of the conductor 122 based on the positions of the positive electrode tab 132 and the negative electrode tab 133, the conductor 122 can directly counteract the interfering magnetic field acting on the audio component 11, with low cost, high accuracy, and few structural changes, improving the sound effect of the speaker assembly 1 and the earphone 2 using the speaker assembly 1.

In some embodiments, determining the assembly region of the conductor 122 based on the positions of the positive electrode tab 132 and the negative electrode tab 133 can include: determining formation of the main interference section 1312 between the positive electrode tab 132 and the negative electrode tab 133 of the core 131, and determining the assembly region based on a projection of the main interference section 1312 in the thickness direction of the battery 13. By defining the position of the conductor 122 as a whole, it can be determined that the region where the conductor 122 generates the magnetic field basically coincides with the region where the interfering magnetic field is generated. At this time, by making the counteracting current equal in magnitude and opposite in direction to the system current, the interfering magnetic field acting on the audio component 11 can be counteracted. The above method not only simplifies the structure of the speaker assembly 1, but also improves the control convenience.

In the above embodiments, an intensity of the counteracting magnetic field can be adjusted based on an intensity of the interfering magnetic field of the battery 13 in a working state, and the working state at least includes an audio playback state and a call state. Due to the difference in the intensity of the interfering magnetic field generated in the audio playback state and the call state, which acts on the audio component 11, the above solution can match the intensity of the interfering magnetic field with the working state of the battery 13. For example, the intensity of the interfering magnetic field generated in the audio playback state should be counteracted by the intensity of the counteracting magnetic field, which is expected to be equal in magnitude and opposite in direction, to avoid interference of the intensity of the counteracting magnetic field with a working stroke of the speaker.

In some embodiments, the magnetic field counteracting component 12 is arranged on the second end face 111, the conductor 122 is fixed in the assembly region, and the insulating layer 121 is between the conductor 122 and the second end face 111. This may include: arranging the insulating layer 121 on the second end face 111, determining the assembly region on the insulating layer 121, and fixing the conductor 122 in the assembly region. The insulating layer 121 can avoid the functional interference of the conductor 122 with the audio component 11.

In some embodiments, the insulating layer 121 is a packaging structural member on the audio component 11. The packaging structural member serves as a partial structure of the audio component 11, and there is no need to add the insulating layer 121 to the audio component 11. In other embodiments, the insulating layer 121 is an insulating adhesive layer bonded to the audio component 11. The insulating adhesive layer cannot only avoid the functional interference of the conductor 122 with the audio component 11, but also be fixed to the audio component 11 using its own adhesive function.

In some embodiments, the magnetic field counteracting method also includes: electrically connecting a first end of the conductor 122 to the positive electrode tab 132, and electrically connecting a second end of the conductor 122 to the negative electrode tab 133.

The conductor 122 is connected in series with the battery 13, to obtain the counteracting current that is equal in magnitude and opposite in direction to the system current of the battery 13. In embodiments where it is necessary to input into the conductor 122 the counteracting current that is equal in magnitude and opposite in direction to the system current, the way that the conductor 122 is connected in series with the battery 13 can simplify the structure and control scheme of the speaker assembly 1. When the speaker assembly 1 is working, the conductor 122 can obtain the counteracting current equal in magnitude and opposite in direction to the system current.

In some embodiments, the conductor includes a first end and a second end; and in a thickness direction of the battery, the first end corresponds to a position the positive electrode tab and the second end corresponds to a position of the negative electrode tab.

In some embodiments, the core forms a main interference section between the positive electrode tab and the negative electrode tab, and a projection of the conductor in the thickness direction of the battery coincides with the main interference section.

In some embodiments, an included angle between the positive electrode tab and the negative electrode tab comprises 90°, and the conductor includes a ¼ circular ring assembled on the insulating layer; or an included angle between the positive electrode tab and the negative electrode tab is 180°, and the conductor includes a ½ circular ring assembled on the insulating layer.

In some embodiments, the conductor is in an edge region of the second end face.

In some embodiments, the conductor includes a flexible circuit board or a wire assembled on the insulating layer.

In some embodiments, the battery includes a soft-packed battery, and the positive electrode tab and the negative electrode tab are exposed outside the core; or the battery includes a hard-packed battery, and the positive electrode tab and the negative electrode tab are arranged inside the core; in a thickness direction of the battery, at least a portion of the conductor corresponds to positions of the positive electrode tab and the negative electrode tab.

In some embodiments, the conductor is connected in series with the battery, to obtain the counteracting current that is equal in magnitude and opposite in direction to the system current of the battery.

In some embodiments, the insulating layer covers the second end face; or the insulating layer includes a packaging structural member on the audio component; or the insulating layer includes an insulating adhesive layer bonded to the audio component.

In some embodiments, determining the assembly region of the conductor based on the positions of the positive electrode tab and the negative electrode tab includes: determining formation of a main interference section between the positive electrode tab and the negative electrode tab of the core; and determining the assembly region based on a projection of the main interference section in the thickness direction of the battery.

In some embodiments, the magnetic field counteracting method further includes: adjusting an intensity of the counteracting magnetic field based on an intensity of a magnetic field of the battery in a working state that at least includes an audio playback state and a call state.

In some embodiments, arranging the magnetic field counteracting component on the second end face, fixing the conductor in the assembly region, and arranging the insulating layer between the conductor and the second end face includes: arranging the insulating layer on the second end face; and determining the assembly region on the insulating layer, and fixing the conductor in the assembly region.

In some embodiments, the magnetic field counteracting method further includes: electrically connecting a first end of the conductor to the positive electrode tab, and electrically connecting a second end of the conductor to the negative electrode tab.

The technical solutions of the present disclosure can achieve at least the following beneficial effects. Since the speaker assembly includes the magnetic field counteracting component, and the magnetic field counteracting component is arranged on the end face of the audio component facing the battery with the electrode tabs, when the counteracting current into the conductor forms the counteracting magnetic field acting on the audio component, the counteracting magnetic field and the interfering magnetic field applied by the battery to the audio component can cancel each other out. The above solution is directed at counteraction of the interfering magnetic field acting on the audio component, has low cost, high accuracy, and few structural changes, and improves the sound effect of the speaker assembly and the earphone using the speaker assembly.

The above description only involves some embodiments of the present disclosure and is not intended to limit the present disclosure. Any modifications, equivalent substitutions, or improvements made within the principles of the present disclosure should be included in the protection scope of the present disclosure.

What is claimed is:

1. A speaker assembly, comprising:

a battery comprising a core, a positive electrode tab, and a negative electrode tab, the positive electrode tab and the negative electrode tab being electrically connected to the core and being arranged on a first end face of the core;

an audio component comprising a second end face facing the first end face; and a magnetic field counteracting component arranged on the second end face and comprising a conductor;

wherein a counteracting current into the conductor forms a counteracting magnetic field acting on the audio component, and the counteracting magnetic field counteracts an interfering magnetic field acting by the battery on the audio component;

wherein the magnetic field counteracting component further comprises an insulating layer between the conductor and the second end face;

the insulating layer covers the second end face; and the insulating layer comprises an insulating adhesive layer bonded to the audio component, and is configured to avoid a functional interference of the conductor with the audio component.

2. The speaker assembly according to claim 1, wherein:

the conductor comprises a first end and a second end; and in a thickness direction of the battery, the first end corresponds to a position of the positive electrode tab and the second end corresponds to a position of the negative electrode tab.

3. The speaker assembly according to claim 2, wherein the core forms a main interference section between the positive electrode tab and the negative electrode tab, and a projection of the conductor in the thickness direction of the battery coincides with the main interference section.

4. The speaker assembly according to claim 2, wherein:

an included angle between the positive electrode tab and the negative electrode tab comprises 90°, and the conductor comprises a ¼ circular ring assembled on the insulating layer; or an included angle between the positive electrode tab and the negative electrode tab is 180°, and the conductor comprises a ½ circular ring assembled on the insulating layer.

5. The speaker assembly according to claim 1, wherein the conductor is in an edge region of the second end face.

6. The speaker assembly according to claim 1, wherein the conductor comprises a flexible circuit board or a wire assembled on the insulating layer.

7. The speaker assembly according to claim 1, wherein:

the battery comprises a soft-packed battery, and the positive electrode tab and the negative electrode tab are exposed outside the core;

or the battery comprises a hard-packed battery, and the positive electrode tab and the negative electrode tab are arranged inside the core; and in a thickness direction of the battery, at least a portion of the conductor corresponds to positions of the positive electrode tab and the negative electrode tab.

8. The speaker assembly according to claim 1, wherein the conductor is connected in series with the battery, to obtain the counteracting current that is equal in magnitude and opposite in direction to a system current of the battery.

9. An earphone comprising a speaker assembly, wherein the speaker assembly comprises:

a battery comprising a core, a positive electrode tab, and a negative electrode tab, the positive electrode tab and the negative electrode tab being electrically connected to the core and being arranged on a first end face of the core;

an audio component comprising a second end face facing the first end face; and a magnetic field counteracting component arranged on the second end face and comprising a conductor, wherein the magnetic field counteracting component further comprises an insulating layer between the conductor and the second end face; the insulating layer covers the second end face; and the insulating layer comprises an insulating adhesive layer bonded to the audio component, and is configured to avoid a functional interference of the conductor with the audio component;

wherein a counteracting current into the conductor forms a counteracting magnetic field acting on the audio component, and the counteracting magnetic field counteracts an interfering magnetic field acting by the battery on the audio component.

10. The earphone according to claim 9, wherein:

the conductor comprises a first end and a second end; and in a thickness direction of the battery, the first end corresponds to a position of the positive electrode tab and the second end corresponds to a position of the negative electrode tab.

11. The earphone according to claim 10, wherein the core forms a main interference section between the positive electrode tab and the negative electrode tab, and a projection of the conductor in the thickness direction of the battery coincides with the main interference section.

12. The earphone according to claim 10, wherein:

an included angle between the positive electrode tab and the negative electrode tab comprises 90°, and the conductor comprises a ¼ circular ring assembled on the insulating layer; or an included angle between the positive electrode tab and the negative electrode tab is 180°, and the conductor comprises a ½ circular ring assembled on the insulating layer.

13. The earphone according to claim 9, wherein the conductor is in an edge region of the second end face.

14. The earphone according to claim 9, wherein the conductor comprises a flexible circuit board or a wire assembled on the insulating layer.

15. A magnetic field counteracting method, applied to a speaker assembly, wherein the speaker assembly comprises: a battery comprising a core, a positive electrode tab, and a negative electrode tab, the positive electrode tab and the negative electrode tab being electrically connected to the core and being arranged on a first end face of the core; an audio component comprising a second end face facing the first end face; and a magnetic field counteracting component arranged on the second end face and comprising a conductor, wherein the magnetic field counteracting component further comprises an insulating layer between the conductor and the second end face; the insulating layer covers the second end face; and the insulating layer comprises an insulating adhesive layer bonded to the audio component, and is configured to avoid a functional interference of the conductor with the audio component; wherein a counteracting current into the conductor forms a counteracting magnetic field acting on the audio component, and the counteracting magnetic field counteracts an interfering magnetic field acting by the battery on the audio component, wherein the magnetic field counteracting method comprises:

determining an assembly region of the conductor based on positions of the positive electrode tab and the negative electrode tab; and arranging the magnetic field counteracting component on the second end face, fixing the conductor in the assembly region, and arranging the insulating layer between the conductor and the second end face;

wherein arranging the magnetic field counteracting component on the second end face, fixing the conductor in the assembly region, and arranging the insulating layer between the conductor and the second end face comprises:

arranging the insulating layer on the second end face; and determining the assembly region on the insulating layer, and fixing the conductor in the assembly region.

16. The magnetic field counteracting method according to claim 15, wherein determining the assembly region of the conductor based on the positions of the positive electrode tab and the negative electrode tab comprises:

determining formation of a main interference section between the positive electrode tab and the negative electrode tab of the core; and determining the assembly region based on a projection of the main interference section in a thickness direction of the battery.

17. The magnetic field counteracting method according to claim 16, further comprising:

electrically connecting a first end of the conductor to the positive electrode tab, and electrically connecting a second end of the conductor to the negative electrode tab.

18. The magnetic field counteracting method according to claim 15, further comprising:

adjusting an intensity of the counteracting magnetic field based on an intensity of a magnetic field of the battery in a working state, wherein the working state at least comprises an audio playback state and a call state.

* * * * *